(12) United States Patent
Lee et al.

(10) Patent No.: US 6,579,665 B2
(45) Date of Patent: Jun. 17, 2003

(54) THIN-FILM MAGNETIC RECORDING HEAD MANUFACTURE

(75) Inventors: Randall Grafton Lee, Byfield, MA (US); Charles J. Libby, Winchester, MA (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 10/085,490

(22) Filed: Feb. 28, 2002

(65) Prior Publication Data

US 2002/0144892 A1 Oct. 10, 2002

Related U.S. Application Data

(63) Continuation of application No. 09/370,753, filed on Aug. 9, 1999, now Pat. No. 6,354,438, which is a continuation of application No. 08/810,837, filed on Mar. 4, 1997, now Pat. No. 6,004,437, which is a continuation-in-part of application No. 08/635,063, filed on Apr. 19, 1996, now Pat. No. 5,916,424.

(51) Int. Cl.[7] ......................... G11B 5/127; G11B 5/187; G11B 5/66; G03C 5/56
(52) U.S. Cl. ...................... 430/311; 430/313; 430/322; 360/55; 360/110; 360/122; 428/694; 428/692
(58) Field of Search ................. 430/311, 313, 430/322; 360/55, 110, 122; 428/694, 692

(56) References Cited

U.S. PATENT DOCUMENTS

| 4,457,803 A | 7/1984 | Takigawa | 156/626 |
| 4,874,947 A | * 10/1989 | Ward et al. | 250/309 |

(List continued on next page.)

FOREIGN PATENT DOCUMENTS

| EP | 0 452 846 A2 | 10/1991 |
| GB | 2 166 888 A | 5/1986 |

(List continued on next page.)

OTHER PUBLICATIONS

Futamoto, Masaaki et al., "Development of Technologies for 2–Gb/in2 Areal Density Recording", *Electronics and Communications in Japan, Part II–Electronics*, vol. 76, No. 3 (Mar. 1993) pp. 94–103.

(List continued on next page.)

*Primary Examiner*—Mark F. Huff
*Assistant Examiner*—Daborah Chacko-Davis
(74) *Attorney, Agent, or Firm*—Michael O. Scheinberg

(57) ABSTRACT

This invention relates to a multi-layer lithographically fabricated device used to produce improved thin-film recording heads. It further relates to a focused particle beam system for milling a recording head pole-tip assembly without irradiating a sensitive structure, e.g. a read head, of the recording head. The invention precisely forms a pole-tip assembly by milling a second structural element without irradiating a first structural element. The invention avoids irradiating the first structural element by placing a first marker element, which can be imaged and/or damaged, in the same layer of a multi-layer lithographically fabricated device as the first structural element. The marker element has a fixed spatial relationship to the first structural element. Thus, by imaging the first marker element and the second structural element, and knowing the separation between the first structural element and the first marker element, a focused particle beam system can determine the relative location of the first and second structural elements. Consequently, the focused particle beam system can determine, without irradiating the sensitive first structural element, which portions of the second structural element require milling. In this manner, the focused particle beam system mills the second structural element to produce a desired pole-tip configuration. By producing a desired pole-tip configuration, these methods and apparatus produce an improved recording head capable of higher storage density than prior art techniques.

6 Claims, 10 Drawing Sheets

U.S. PATENT DOCUMENTS

| | | | |
|---|---|---|---|
| 5,079,662 A | | 1/1992 | Kawakami et al. .......... 360/113 |
| 5,217,819 A | * | 6/1993 | Peterson et al. ............. 428/693 |
| 5,314,596 A | * | 5/1994 | Shukovsky et al. ....... 204/192.2 |
| 5,401,972 A | * | 3/1995 | Talbot et al. ............. 250/491.1 |
| 5,404,635 A | | 4/1995 | Das .............................. 29/603 |
| 5,452,166 A | | 9/1995 | Aylwin et al. ............... 360/126 |
| 5,495,378 A | | 2/1996 | Bonyhard et al. ........... 360/113 |
| 5,916,424 A | * | 6/1999 | Libby et al. ............ 204/298.36 |
| 6,004,437 A | * | 12/1999 | Lee et al. .............. 204/192.34 |

FOREIGN PATENT DOCUMENTS

| | | | |
|---|---|---|---|
| GB | 2 227 601 | * | 8/1990 |
| JP | 60010407 | | 1/1985 |
| JP | 04044610 | | 2/1992 |
| JP | 04205705 | | 7/1992 |
| JP | 05143938 | | 6/1993 |
| JP | 05143939 | | 6/1993 |
| JP | 06338033 | | 12/1994 |
| JP | 06349026 | | 12/1994 |
| WO | WO 97/40493 | | 10/1997 |

OTHER PUBLICATIONS

Mallinson, John C., *Magneto–Resistive Heads, Fundamentals and Applications*, (Academic Press, Inc., San Diego 1996) Chapter 8, pp. 66–78 and Chapter 14, pp. 110–119.

* cited by examiner

THIN-FILM MAGNETIC RECORDING HEAD MANUFACTURE

CROSS-REFERENCES

This is a continuation of, co-pending U.S. application Ser. No. 09/370,753 filed on Aug. 9, 1999 now U.S. Pat. No. 6,354,438, of Lee et al. entitled Thin-Film Magnetic Recording Head Manufacture, which in turn is a continuation of Ser. No. 08/810,837 filed on Mar. 4, 1997 now U.S. Pat. No. 6,004,437 of Lee et al. entitled Thin-Film Magnetic Recording Head Manufacture, which in turn is a continuation-in-part of Ser. No. 08/635,063 filed on Apr. 19, 1996 now U.S. Pat. No. 5,916,424.

BACKGROUND

This invention relates to methods and apparatus for manufacturing improved thin-film magnetic recording heads. More specifically, the invention relates to a multi-layer lithographically fabricated device used to produce the improved thin-film recording heads. It further relates to a focused particle beam system for milling a recording head pole-tip assembly without irradiating a sensitive structure, e.g. a read head, of the recording head.

Thin-film magnetic recording heads have gained wide acceptance in the data storage industry. A thin-film recording head has a small, precisely formed pole-tip assembly. The size and shape of the pole-tip assembly, which includes features on the order of one-half a micron, in part determines the magnetic field pattern produced by the recording head. This magnetic field pattern effects how narrowly the recording head can record data tracks on the magnetic media of magnetic memory storage devices, such as computer hard disks, and digital data tape drives.

Thinner data tracks allow a storage device to store more data tracks per area of media and therefore more data per device. Accordingly, precisely forming the pole-tip assembly of the recording head results in an increase in the total data storage capacity of a magnetic memory device. Manufacturers seek to form the geometry of the pole-tip assembly with high precision, and consequently achieve pole-tip assemblies capable of providing magnetic field patterns suitable for writing narrow tracks of recorded data.

Manufacturers presently endeavor to form the precise shape of the pole-tip assembly by employing a lithographic technique to fabricate a multi-layer device. The multi-layer device contains the structure for a recording head. As stated above a thin-film recording head has a small pole-tip assembly. Typically, the lithographic technique deposits alternating layers of conductive and insulating materials onto a substrate by an evaporation, sputtering, plating, or other deposition technique that provides precise control of the deposition thicknesses. Chemical etching, reactive ion etching (RIE), or other mechanisms shape and form the deposited layers into a pole-tip assembly having the desired geometry. Thus, the pole-tip assembly is contained within a multi-layer lithographically fabricated device.

Although existing lithographic techniques work sufficiently well to provide pole-tip assemblies having feature sizes suitable for current data storage capacity, these lithographic techniques are limited as to the small feature sizes that they can produce. For example, present photolithographic techniques require precise application of photoresist layers. Commonly, the photoresist layer is applied to produce a topology that includes voids having 10:1 aspect ratios. Such topologies are difficult to achieve reliably using such a photoresist technique.

Thus, these lithographic techniques are poorly suited for achieving a high yield of precisely formed pole-tip assemblies. In the interest of increased areal storage density, manufacturers decrease the dimensions of a desired pole-tip assembly. As the dimensions of the desired pole-tip assembly decrease, manufacturers, using existing lithographic techniques, experience high yield loss. In other words, even if manufacturers using existing lithographic techniques are successful achieving a desired pole-tip assembly configuration, they will achieve that desired configuration with a low yield (e.g. only 20–40% of the recording heads produced using existing lithographic techniques will have the desired configuration).

The defective structures that occur during the manufacturing process are difficult to predict and are prone to wide variations. Accordingly, the application of a universal photoresist pattern to the surface of a pole-tip assembly is a generalized solution that often is ill suited to the actual manufacturing defect of any one recording head. Therefore, current techniques for producing a magnetic recording head have several serious limitations with respect to ability to control the physical geometry of the recording head.

Consequently, current techniques are often unacceptable for accurately shaping recording heads for use in the higher density data storage devices desired for computers. More specifically, higher density data storage devices can require micromachining of the recording head used with the devices. Manufacturers can micromachine the recording head while it is contained in a multi-layer lithographically fabricated device. The micromachining of the recording head can require accurate shaping of a second structural element, e.g. the write head, in a second layer in relation to a first structural element, e.g. the read head, in a first layer. However, the first structure can be a sensitive structure such as a Magneto-Resistive Stripe (MRS). For background information on the design and function of MRSs and inductive write heads, see Magneto-Resistive Heads, Fundamentals and Applications by John C. Mallinson (Academic Press, Inc., San Diego 1996).

It is important to note that both the MRS and the write head can each have sublayers. MRS's can include thin-film sublayers five to six angstroms thick. Thus, the focused particle beam system cannot image the first structure to determine the desired shape and location of the second structure because the first structure could be damaged by the imaging process. Furthermore, the associated layer-to-layer registration errors due to lithographic overlay tolerances are larger than the accuracy to which the system must shape the second structure.

Accordingly, it is an object of the present invention to provide methods and apparatus for manufacturing improved thin-film magnetic recording heads, and, more particularly, for precisely forming the pole-tip assembly of a magnetic recording head without irradiating a sensitive structure, e.g. a read head, in the recording head.

It is a further object of the present invention to provide a multi-layer lithographically fabricated device for manufacturing improved thin-film recording heads.

It is a further object of the present invention to provide a lithographic process for fabricating a multi-layer device for manufacturing improved thin-film recording heads.

It is yet another object of the present invention to provide methods and apparatus for manufacturing improved thin-film recording heads using a focused particle beam.

The invention is next described in connection with certain embodiments; however, it will be clear to those skilled in the art of semiconductor device fabrication that various modifications, additions and subtractions can be made to the described embodiments without departing from the spirit or scope of the invention.

SUMMARY OF THE INVENTION

One embodiment of the invention precisely forms a pole-tip assembly by milling a second structural element without irradiating a first structural element. The invention avoids irradiating the first structural element by placing a first marker element, which can be imaged and/or damaged, in the same layer of a multi-layer lithographically fabricated device as the first structural element. The marker element has a fixed spatial relationship to the first structural element. Thus, by imaging the first marker element and the second structural element, and knowing the separation between the first structural element and the first marker element, a focused particle beam system can determine the relative location of the first and second structural elements. Consequently, the focused particle beam system can determine, without irradiating the sensitive first structural element, which portions of the second structural element require milling. In this manner, the focused particle beam system mills the second structural element to produce a desired pole-tip configuration. By producing a desired pole-tip configuration, these methods and apparatus produce an improved recording head capable of higher storage density than prior art techniques.

Thus, the invention provides lithographic methods and apparatus for manufacturing improved thin-film recording heads. Furthermore, the invention provides methods and apparatus for employing a focused particle beam to mill a recording head pole-tip assembly without irradiating a sensitive structure, e.g. a read head, of the pole-tip assembly. A focused particle beam for practice of the invention can include an ion beam, electron beam, x-ray beam, optical beam or other similar source of directable radiant energy.

One embodiment of the lithographic method includes the following steps: i) pattern, in a common first lithographic layer, a first structural element and, at a known distance and direction, a first marker element; and ii) pattern, in a common second lithographic layer, a second structural element and a second marker element. The above patterning steps provide the structural elements and the marker elements in a spatial arrangement such that they intersect a geometrical surface that extends transversely to the first and second lithographic layers. Consequently, viewing the first marker element and at least one of the second structural element or the second marker element, at the geometrical surface, provides information for locating the second structural element relative to the first structural element. In one embodiment, the second structural element and the second marker element are the same element. In another embodiment, the second marker element is located at a known distance and direction relative to the second structural element.

One embodiment of the process described above provides a multi-layer lithographically fabricated device including a first and second layer. The first layer has a first structural element, and, at a known distance and direction relative thereto, a first marker element. The second layer has a second structural element, and, a second marker element. The structural and marker elements intersect a geometrical surface that extends transversely to the first and second layers so that viewing the first marker element and at least one of the second structural element and the second marker element, at the geometrical surface, provides information for locating the second structural element relative to the first structural element. As stated above, in one embodiment, the second structural element and the second marker element are the same element. In another embodiment, the second marker element is located at a known distance and direction relative to the second structural element.

According to another aspect of the invention, subsequent to the lithographic fabrication of the multi-layer device, manufacturers cleave the device along the above mentioned geometrical surface. Cleaving the device along the geometrical surface exposes the structural and marker elements.

According to another aspect, the invention provides methods and apparatus for employing a focused particle beam system to image marker elements on a multi-layer lithographically fabricated device containing the structure for a magnetic recording head. These processes further employ a processor to generate milling signals based on the physical location of the marker elements as determined from an imaging step. Those signals direct a focused particle beam to remove selected portions of the recording head and thereby shape the recording head. More specifically, according to this method, the focused particle beam can remove selected portions of the write head without irradiation of the read head.

This aspect of the invention thus locates a first structural element with respect to a second structural element in a multi-layer lithographically fabricated device in the following manner. In a first step, image, with a focused particle beam, first marker element and at least one of the second structural element and the second marker element on the multi-layer device. The first structural element is in a first lithographic layer, and the first marker element is in the same first lithographic layer at a known distance and direction from the first structural element. The second structural element is in a second lithographic layer, and the second marker element is in the same second lithographic layer. The structural elements and the marker elements intersect a geometrical surface that extends transversely to the first and second lithographic layers. In a second step, determine, responsive to the first imaging step, the location of the second structural element relative to the location of the first structural element. This determining step can include the processing of information provided by the imaging step for providing information concerning the location of the marker elements. As stated above, in one embodiment, the second structural element and the second marker element are the same element. In another embodiment, the second marker element is located at a known distance and direction relative to the second structural element.

According to yet another aspect, the invention provides an apparatus for shaping a pole-tip assembly of a recording head. The apparatus includes a focused particle beam for selectively interacting with the multi-layer device describe above. The apparatus includes a platform for receiving the multi-layer device containing the structure for the recording head with a pole-tip assembly and for disposing the multi-layer device for contact with the focused particle beam. The apparatus includes a system for generating image signals responsive to the interaction of the focused particle beam with the first marker element and at least one of the second structural element and the second marker element on the multi-layer device and for generating, responsive to the image signals, a coordinate signal representative of a position of the second structural element relative to the first structural element and relative to the focused particle beam. The apparatus further includes a processor responsive to the coordinate signal for generating a milling signal representative of an instruction for applying the focused particle beam to a selected portion of the second structural element for milling the selected portion of the second structural element.

Thus, according to a preferred embodiment of the invention described above, the focused particle beam system images the first marker element and the second structural element located in the multi-layer device. From the location of the first marker element and the second structural element, derived from the images of these elements, the system determines, without irradiating a sensitive first structural element, which portions of the second structural element require milling so as to produce a desired pole-tip configuration. By producing a desired pole-tip configuration, these methods and apparatus produce an improved recording head capable of higher storage density than prior art techniques.

These and other aspects of the invention are evident in the drawings and in the description which follows.

BRIEF DESCRIPTION OF THE DRAWINGS

The foregoing and other objects, features and advantages of the invention will be apparent from the following description and apparent from the accompanying drawings, in which like reference characters refer to the same parts throughout the different views.

DESCRIPTION OF ILLUSTRATED EMBODIMENTS

The invention provides lithographic fabrication methods and lithographically fabricated devices for manufacturing improved thin-film recording heads. The invention further provides improved methods and apparatus for employing a focused particle beam to manufacture improved thin-film magnetic heads. The invention is understood from the following detailed description of certain exemplary embodiments.

Figure 1:
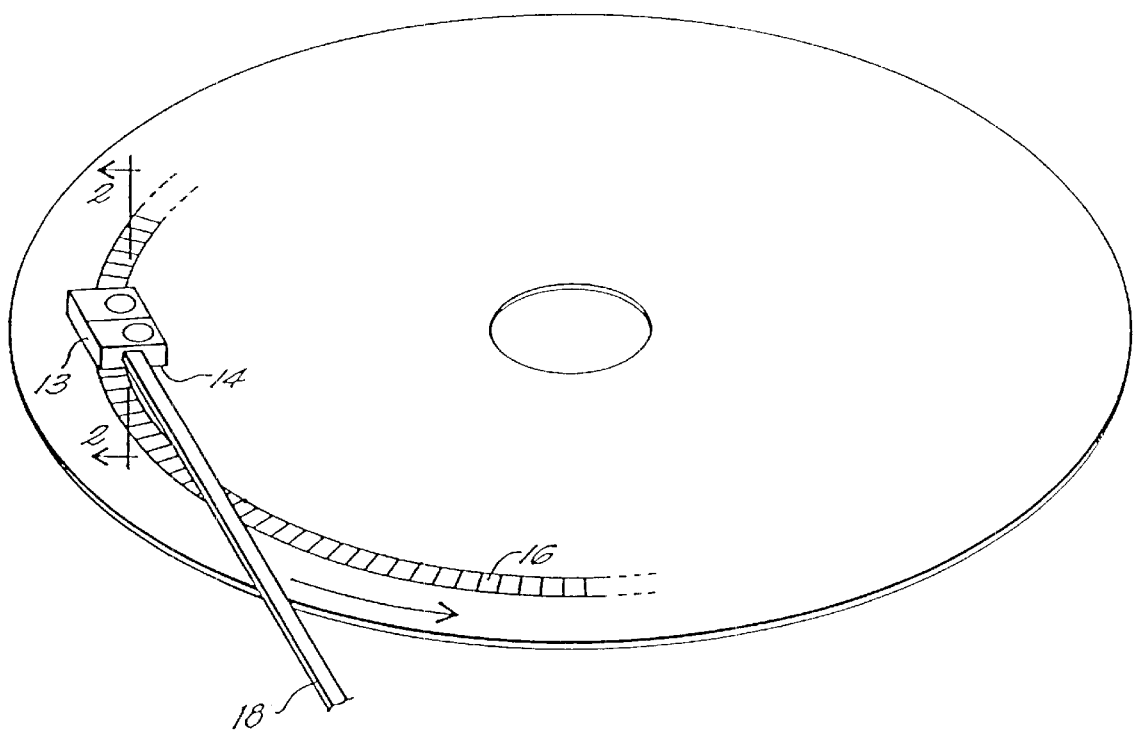
FIG. 1 is a simplified view of a thin-film magnetic recording head according to the invention disposed above a data track of a magnetic medium.

FIG. 1 illustrates an example of one type of thin-film recording head. FIG. 1 depicts a hard computer-memory disk 15, a recording head 13, a pole-tip assembly 14, a data track 16, and an extension arm 18. The illustrated recording head 13 is disposed at the distal end of the arm 18 and is located just above the rotating disk 15. The recording head records and reads digital data by generating or detecting magnetization states that form the data track 16 on the disk 15.

Figure 2:
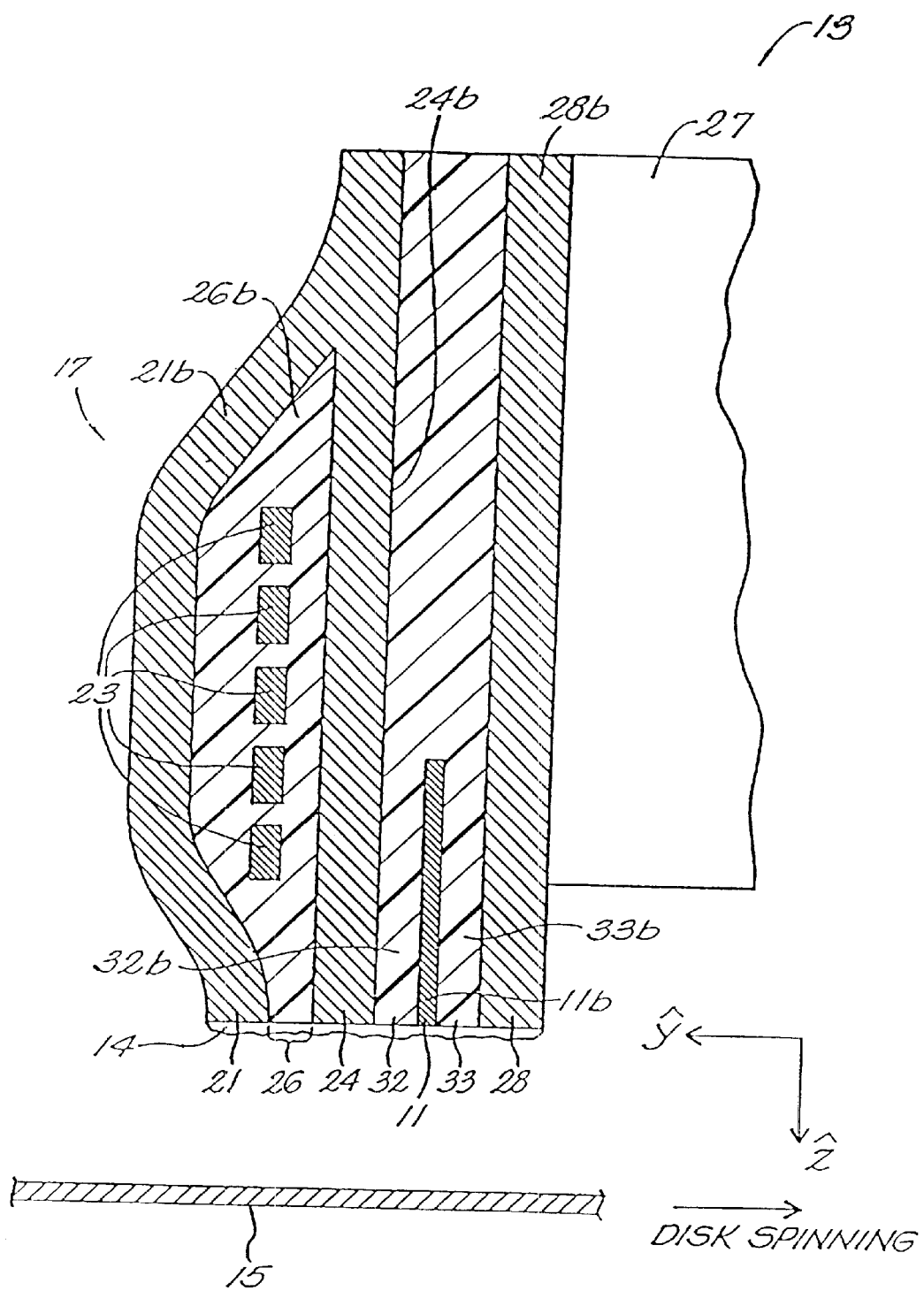
FIG. 2 is a cross sectional view, along section 2—2 of FIG. 1, showing one embodiment of the thin-film magnetic recording head, disposed above a data track of a magnetic medium.

FIG. 2 shows a cross sectional view of one embodiment of the thin-film recording head 12 of FIG. 1, disposed above a data track of a magnetic medium 15. With reference to FIG. 2, the recording head embodiment shown is a thin-film, merged inductive write head and shielded Magneto-Resistive Head (MRH) structure. The recording head 13 has a pole-tip assembly 14 formed from a pole assembly 17. The pole assembly is attached to a slider 27. A pole-tip assembly is defined for the purposes of this application as the elements of the pole assembly that are in proximity to, and that can functionally interact with, the magnetic medium. The illustrated recording head has a pole-tip assembly 14 including elements 21, 24, 11, and 28. According to the invention, these elements are formed from a multi-layer lithographically fabricated device. The device includes conductive layers containing poles and shields. The poles 21b and 24b, the shields 24b and 28b and the Magneto-Resistive Stripe (MRS) 11b are separated, at least at one side. The poles, the shields and the MRS can be separated, at least at one side, by insulating layers 26b, 32b, and 33b. Note that element 24b is both a write pole and a read shield. The recording head as a whole includes a first pole 21b, a second pole/shield 24b, a coil 23, a MRS 11b, and a first shield 28b. The poles, the shields, and the MRS extend into the body of the recording head substantially along a first axis. The first axis is substantially perpendicular to the surface of the pole-tip assembly 14. In the illustrated embodiment, the first axis is marked as the Z axis.

A write head typically includes at least three parts: the core, the coil and the gap. In the example shown in FIG. 2, the core includes poles 21b and 24b. The coil 23, shown in cross section, is wrapped around the core. The write gap 26 separates the pole-tips 21 and 24 of the pole-tip assembly. In thin-film heads, the core structure is usually called the yoke. Thin-film heads can be made of thin layers of permalloy (81Ni/19Fe) or AlFeSil (an aluminum, iron and silicon alloy) in, typically, two to four μm thicknesses. The coil can be made of copper and the gap can be made of $Al_2O_3$.

The coil 23 carries the write current, which is typically of magnitude ten to twenty mA peak. The write current is toggled from one polarity to the other to write digital transitions of the remanent magnetization in the recording medium. The write gap 26 permits the magnetic flux circulating in the core to fringe out and intercept the recording medium. In this way, the read/write head 13 writes digital data into the track 16 (FIG. 1), in the form of a magnetic spot.

Similarly, a magnetic spot on a disk 15 provides a magnetic fringe field. As the read/write head passes proximate to a particular magnetic spot, the head enters the fringe field of the spot. The read head, e.g. a magneto-resistive (MR) head, responds to the magnetic field resulting in a corresponding electrical signal. In the case of a MR head, the magnetic response can be converted to an electrical signal via the anisotropic magneto-resistive effect. The resulting electrical signal reflects the magnetic state of the spot in the track 16 on the disk 15. In this way, the recording head 13 reads magnetic data written on the disk 15.

Figure 3A:
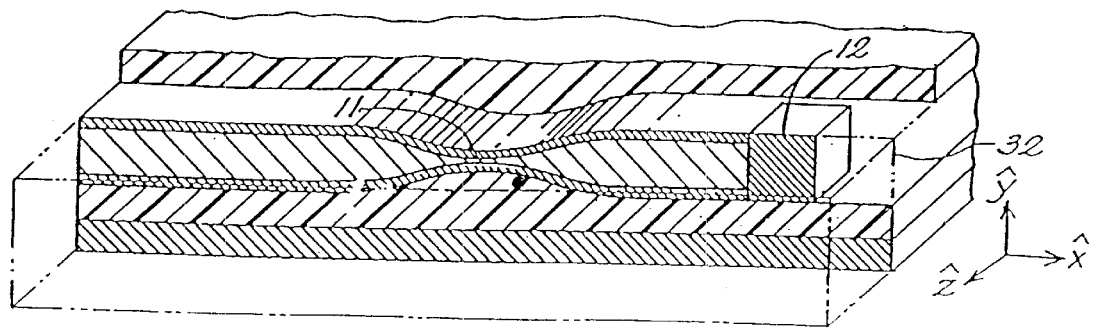
FIGS. 3(a) and 3(b) are perspective views from above of a lithographically fabricated multi-layer device, which contains part of the recording head of FIG. 1, at the completion of a first and second step in the fabrication process, respectively.
Figure 3B:
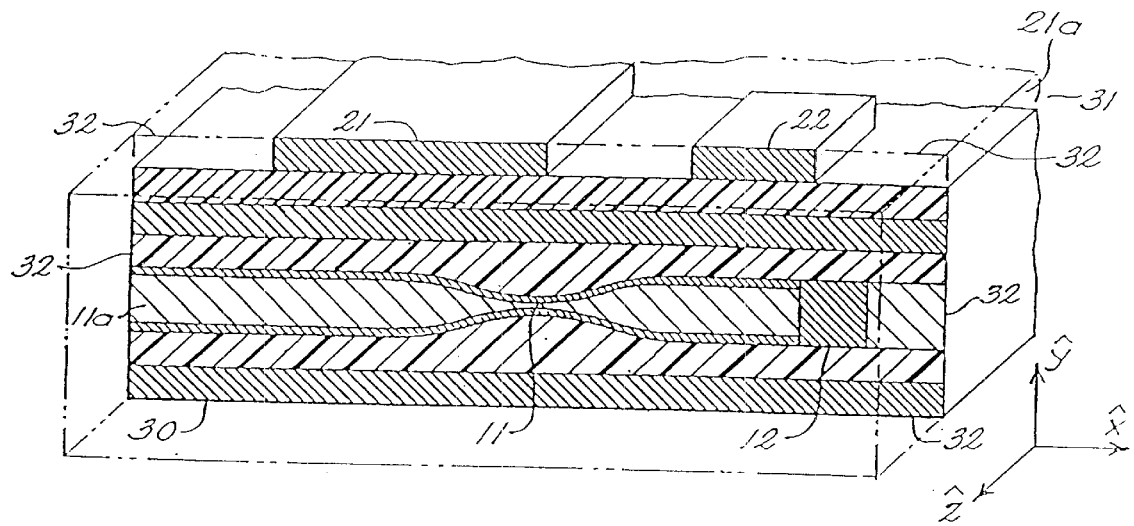

Manufacturers can construct thin-film recording heads from lithographically fabricated multi-layer devices. FIGS. 3(a) and 3(b) are perspective views from above of one embodiment of a lithographically fabricated multi-layer device, which manufacturers can use to produce the recording head of FIG. 1. FIGS. 3(a) and 3(b) show the multi-layer device at the completion of a first and second step in the fabrication process, respectively. FIG. 3(a) shows these lithographic techniques, can be determined without using a FIB system to image the head elements.

Figure 4A:
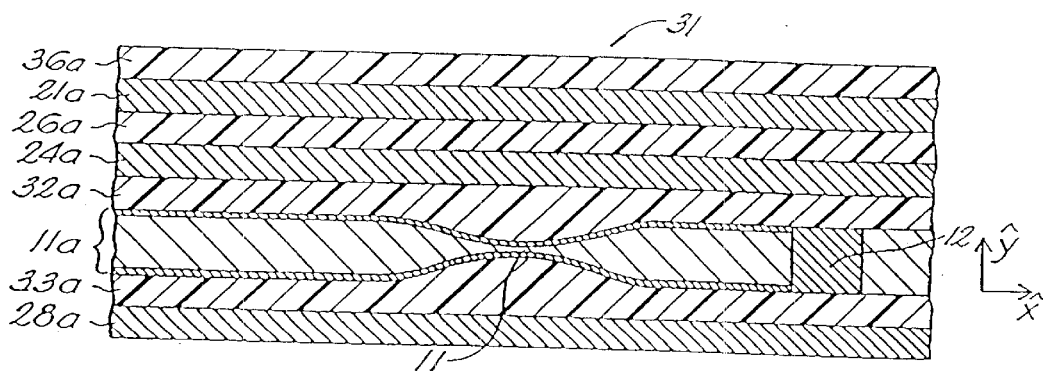
FIGS. 4(a)–4(e) are cross sectional views of the multi-layer device of FIGS. 3(a) and 3(b) at various stages in one embodiment of the fabrication process.

FIG. 4(a) shows a multi-layer device 31 that provides the seven layers of the recording head of FIG. 2. This portion of one embodiment of the fabrication process begins with the application of a layer of photoresist 36a to the surface or top layer 21a of the multi-layer device 31. Thus, FIG. 4(a) shows the multi-layer device at a particular point in one embodiment of the device's fabrication process. At the point in the fabrication process shown in FIG. 4(a), a first patterning step is completed. This first step patterns a first structural element, the read head, 11, and, at a known distance and direction from the first structural element, a first marker element 12. Both elements exist in a common layer 11a.

Figure 4B:
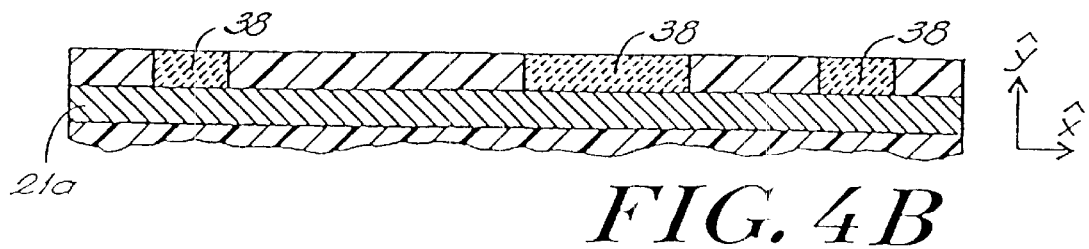
Figure 4C:
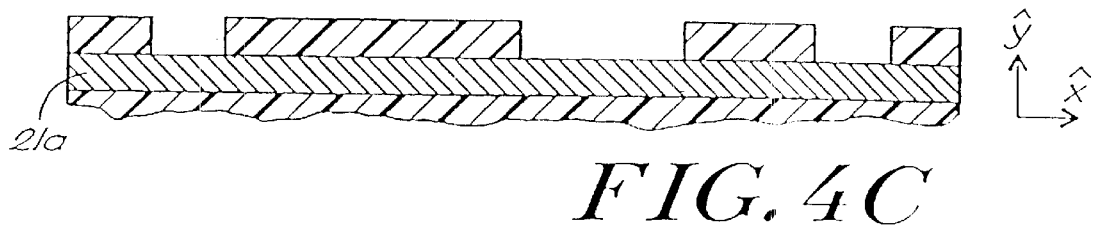
Figure 4D:
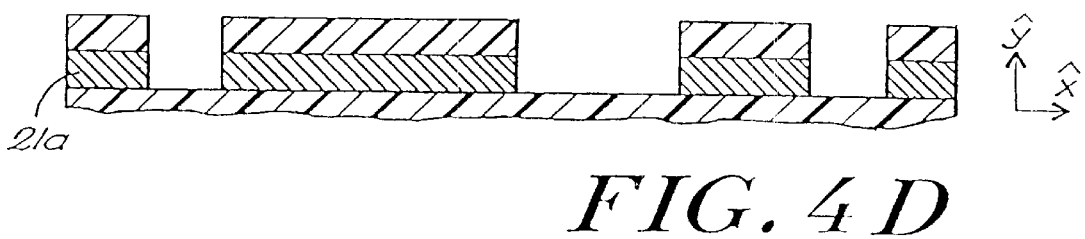

FIGS. 4(b)–4(d) show only the top two layers of FIG. 4(a) because the process shown in these Figures does not alter the bottom six layers. In FIG. 4(b) shading shows regions of the photoresist that have been exposed to light. The desired configuration of elements in layer 21a determines where the photoresist is exposed.

Photoresist is a polymeric mixture that is deposited as a thin layer, perhaps one $\mu$m thick, upon the multi-layer device. Irradiation with light in the near ultraviolet region of the spectrum modifies the chemical properties of the photoresist, and in "positive" photoresist, makes it more soluble to certain developers. Thus, one step frequently employed in microstructure fabrication is the projection of the image of a mask onto the photoresist layer. It becomes possible to remove the exposed region of the photoresist by dissolving it with a suitable developer.

The removal of the exposed photoresist is shown in FIG. 4(c). Etches can then remove portions of layer 21a that were below light exposed areas of the photoresist layer. The removal of these portions of layer 21a is shown in FIG. 4(d). Photoresist is resistant to the etches and the portions of layer 21a that are below the unexposed areas of the photoresist are not affected by the etches.

After etching, a solvent can remove the remaining photoresist, potentially leaving layer 21a with a desired configuration. Importantly, this process can produce defects in elements located in layer 21a. In the example shown, element 21 has at least one defect in that it is too wide. The multi-layer device of FIG. 4(a) with a configured layer 21a and the remaining photoresist removed is shown in FIG. 4(e).

Figure 4E:
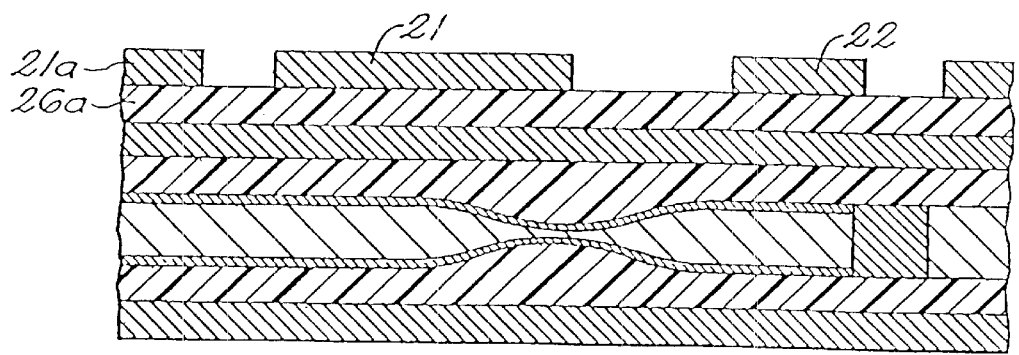

At the point in the fabrication process shown in FIG. 4(e), a second patterning step has been completed. This second step forms a second structural element, the write head, 21. In one embodiment, forming the second structural element completes the second patterning step. In another embodiment, the second patterning step also includes forming a second marker element at a known distance and direction from the second structural element. In the latter embodiment, both elements exist in a common layer 21a.

Thus, in the illustrated embodiment of FIGS. 2–4(e), the invention is understood as a lithographic process including the steps of 1) patterning in a first common lithographic layer 11a, a first structural element 11 (e.g. a read head) and, at a known distance and direction, a first marker element 11a; and 2) patterning in a second common lithographic layer 21a, a second structural element 21 (e.g. a write head) and a second marker element 22. Importantly, the above patterning steps provide the structural and marker elements so that they intersect a single geometrical surface 32 that extends transversely to the first and second lithographic layers. In a preferred embodiment, the geometrical surface is planar. Thus, viewing the second structural element and the first marker element and at least one of the second structural element and the second marker element, at the geometrical surface (i.e. from the X–Y plane), provides information for locating the second structural element relative to the first structural element. In one embodiment, the second structural element and the second marker element are the same element. In another embodiment, the second marker element is located at a known distance and direction relative to the second structural element.

In the illustrated embodiment of FIGS. 2–4(e), the process includes the further step of providing the marker elements with selected spatial overlap along a second axis that extends transversely to the first and second lithographic layers. In the illustrated embodiment, the second axis is substantially parallel to the Y axis. Furthermore, in this embodiment, the process includes yet a further step of providing the structural elements with selected overlap along an axis substantially parallel to the second axis.

Figure 5:
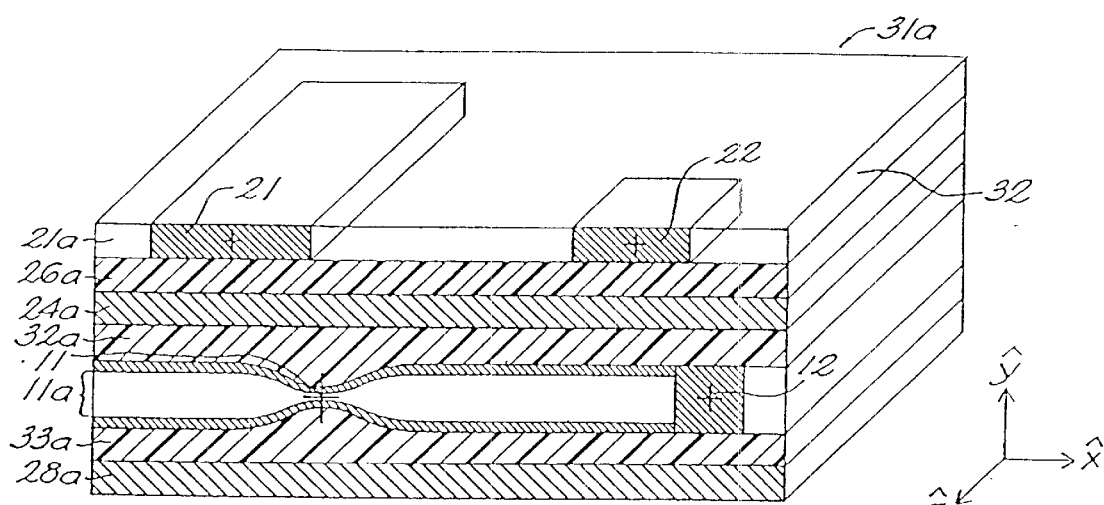
FIG. 5 is a perspective view from above of the multi-layer device of FIG. 3(b) after cleaving the device to expose the read and write heads and their associated marker elements.
Figure 6:
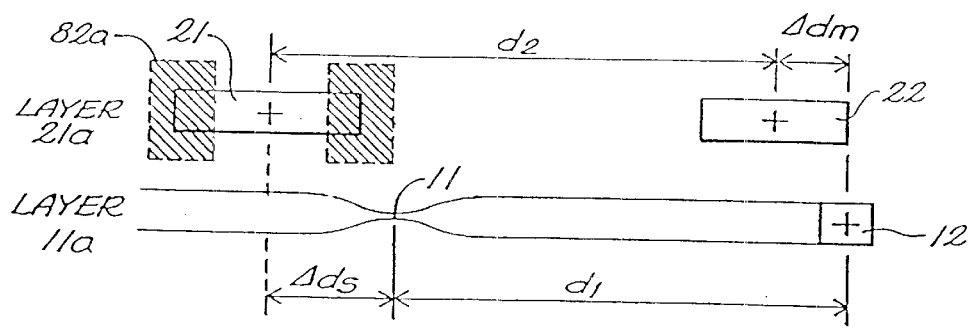
FIG. 6 shows the cleaved, multi-layer device of FIG. 5 containing a defective write head, seen from the plane of the cleaved surface.

FIG. 5 is a perspective view of the multi-layer device of FIG. 3(b) after cleaving the device to expose the read and write heads and their associated marker elements. FIG. 6 shows the cleaved, multi-layer device of FIG. 5, as seen from the plane of the cleaved surface (which, in the illustrated embodiment, is substantially the same as the plane of the magnetic medium). In a preferred embodiment as shown, a first layer 11a includes a first structural element 11 and, at a known distance (d1) along a third axis, a first marker element 12. The third axis is substantially parallel to the layers and to the geometrical surface 32. In the embodiment shown in FIG. 5, the third axis is the X axis. A second layer 21a includes a second structural element 21 and, at a known distance (d2) along the third axis, a second marker element 22. The separation of the marker elements along the third axis is $\Delta d_m$. The separation of the structural elements along the third axis is $\Delta d_s$. The multi-layer device illustrated in FIGS. 5 and 6 contains a write head that is too wide along the illustrated X axis to produce narrow tracks of data. Furthermore, manufacturers desire a specific X axis separation between the centers of the write head 21 and the read head 11. To provide the desired pole-tip configuration, the multi-layer device is inserted into a focused particle beam system according to the invention.

Figure 7:
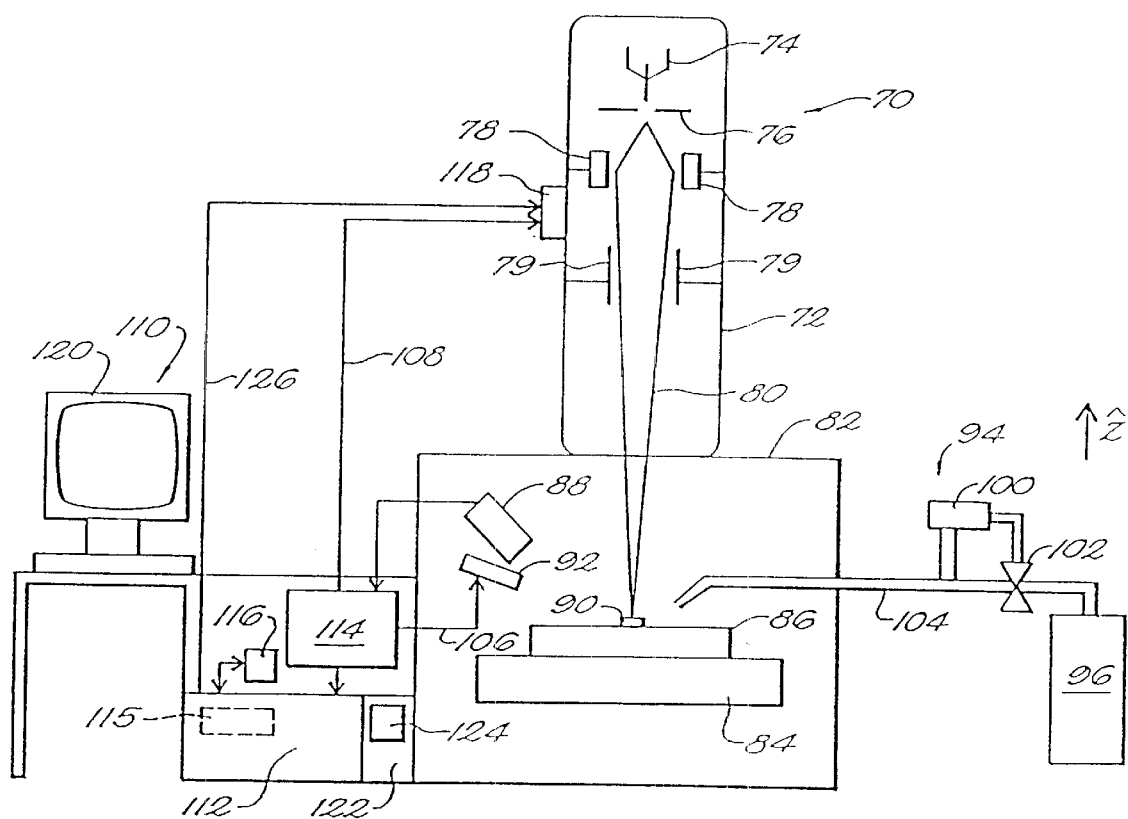
FIG. 7 is a schematic view of one system for manufacturing the thin-film recording head of FIG. 1 according to the invention.

FIG. 7 shows the focused particle beam system 70 for providing a desired pole-tip configuration and for manufacturing the thin-film recording head of FIG. 1. The illustrated system 70 includes an ion column 72, a vacuum chamber 82, an optional reactant material delivery system 94 and user control station 110. The system 70 provides a focused particle beam system that can precisely mill thin-film recording heads, including thin-film recording heads having contoured surfaces. A recording head contained within a multi-layer device is seated within the vacuum chamber 82 and operated on by a particle beam generated by the column 72 to mill the pole-tip assembly of the recording head. For clarity, FIG. 1 shows an example of a recording head 13 that can be seated within chamber 82 and processed by the system 70. A focused ion beam system 70 of this type is commercially available from Micrion Corp. of Peabody, Mass.

The ion column 72 includes an ion source 74, an extraction electrode 76, a focusing element 78, deflection elements 79, and a focused ion beam 80. The ion column 72 sits above the vacuum chamber 82, and the vacuum chamber 82 houses a stage 84, a platform 86, a read/write head 90, a secondary particle detector 88 and a charge neutralization element 92. As further depicted by FIG. 7, the optional reactant material delivery system 94 includes a reservoir 96, a manometer 100, a motorized valve element 102, and delivery conduit 104. The user control station 110 can include a processor 112, a pattern recognition element 114, a memory element 116, a display element 120, a scan generator element 122, and dwell registers 124.

The operation of the ion column 72, charge neutralization element 92, and secondary particle detector 88 are controlled by the control station 110. The depicted control station 110 includes a processor element 112 that has a scan generator element 122 that includes dwell register 124. The processor element 112 couples via a transmission path to a control element 118 coupled to the ion beam column 72. The processor element includes a location processor element 115. The depicted processor element 112 can be a conventional computer processor element that includes a CPU element, a program memory, a data memory, and an input/output device. One suitable processor element 112 is a IBM Risc 6000 Workstation operating a Unix operating system.

As further depicted by FIG. 7, the processor element 112 can connect, via the input/output device to a scan generator element 122. In one embodiment, the scan generator element is a circuit card assembly that connects to the processor 112 via the processor input/output device. The circuit card assembly scan generator element 122 depicted in FIG. 7 includes a scan memory for storing data representative of a scanning pattern that can be implemented by system 70 for scanning ion beam 80 across the surface of the workpiece 90 to selectively mill, or etch the surface of the workpiece 90.

The scan generator board element 122 depicted in FIG. 7 can be a conventional computer memory circuit card having sufficient memory for storing digital data information representative of locations of the recording head that are to be processed by the particle beam system 70. Typically, a scan generator board suitable for practice with the present invention includes a series of memory locations, each of which corresponds to a location on the recording head surface. Each memory location stores data representative of an X and Y location of the recording head and preferably further has, for each X and Y location, a dwell register for storing digital data representative of a time for maintaining the particle beam on the surface of the recording head at the location represented by the associated X, Y pair. Accordingly, the dwell register provides a memory location for storing a dwell time for applying the focused particle beam to the surface of the recording head, to thereby allow control of the dose delivered to the recording head.

It will be apparent to one of ordinary skill in the art of focused particle beam processes and systems that the dose delivered to a location on a workpiece surface can be understood to determine generally the depth to which material is removed from that location of the workpiece. Accordingly, the dwell time signal stored in the dwell register can also be understood as representative of a depth, or Z dimension, for the particle beam milling process. Consequently, the processor 112 that couples to such a scan generator board 122 provides a multi-dimensional milling element for generating milling signals that can control in three dimensions the milling or etching process of the focused particle beam system.

Accordingly, the processor 112 employs the X, Y and Z data maintained by the scan generator board 122 to generate milling signals that are transmitted via the transmission path 126 to the control element 118 of the ion column 72 In the depicted embodiment, the milling signals provide control element 118 with information for operating the deflector elements 79 to deflect the focused particle beam for scanning or rasterizing the focused particle beam across the surface of the recording head 90, and to maintain the particle beam at the selected location for a specified dwell time to provide milling to a selected depth. The surface of the recording head 90 generally corresponds to a two-dimensional plane that can be defined by an orthogonal pair of X and Y axes. A Z axis, that is generally understood as extending parallel to the path of the focused ion beam 80 is also generally orthogonal to the plane defined by the X and Y axis of the surface of the recording head 90. By controlling the location of the particle beam 80 and the period of time for which the beam 80 impacts against the surface of the recording head 90, material at selected locations of the recording head 90 can be removed. Accordingly, the system 70 provides multidimensional control of the milling process to thereby allow the particle beam 80 to remove selected portions of the recording head surface and form a precise shape of the recording head pole-tip assembly.

Although FIG. 7 depicts an ion column 72 that includes deflection elements 79 for deflecting an ion beam 80 to scan across the surface of the recording head 90 and thereby direct the focused ion beam to a selected location on the surface of the recording head 90, it will be apparent to one of ordinary skill in the art of focused particle beam processing that any system suitable for directing the focused particle beam to select locations of the recording head surface can be practiced with the invention. For example, in an alternative embodiment, the platform 84 can be moved in an X, Y or Z space which corresponds to the X, Y and Z space of the milling process and the milling signals generated by the processor 112 can be provided to a stage control system that moves the stage carrying the recording head 90 to thereby dispose a selected portion of the recording head directly in the path of the focused particle beam to mill the recording head 90. Other systems and methods for directing the particle beam can be practiced with the present invention without departing from the scope thereof.

Further it will be apparent to one of ordinary skill in the art of particle beam processes and systems that the depicted scan generator element 122 that is illustrated as a circuit card assembly of read/write computer memory can alternatively be implemented as software program code that runs on a computer platform having an accessible data memory that is configured by the program code to provide storage locations for storing the data representative of the X and Y locations as well as data representative of the dwell time. Such a modification is well within the art of one of ordinary skill and does not depart from the scope of the invention.

Figure 8:
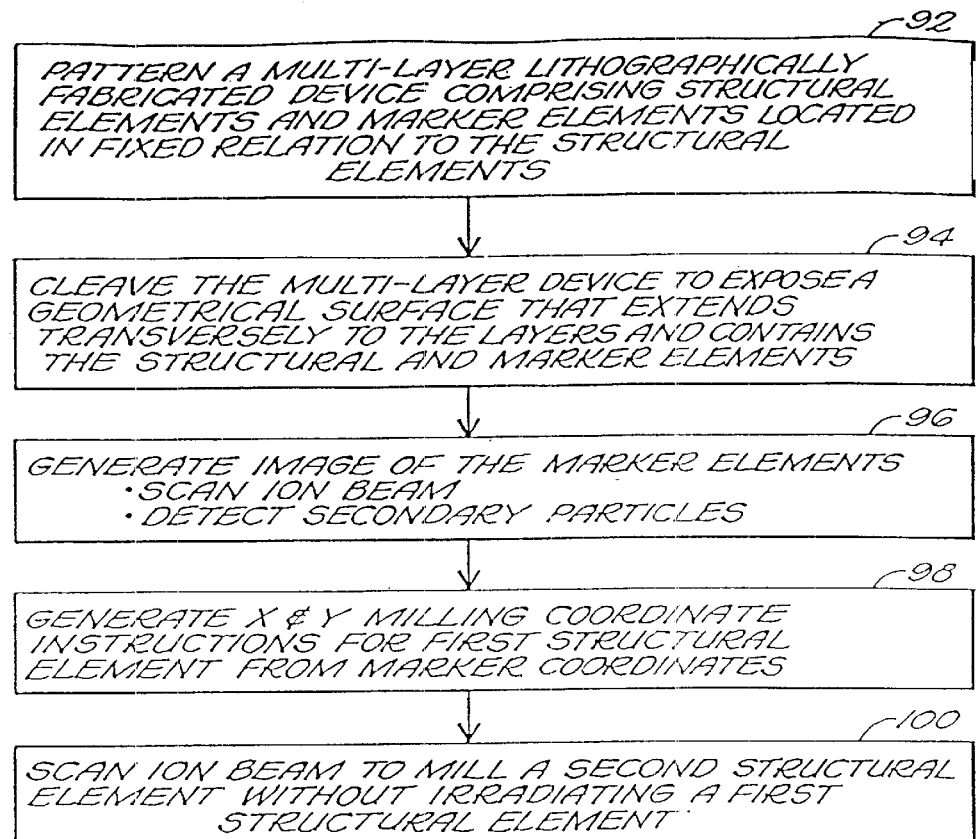
FIG. 8 is a flow chart illustrating one process according to the invention for manufacturing the thin-film recording head of FIG. 1.

The above-described focused particle system of FIG. 7 can operate on the cleaved multi-layer device 31a of FIG. 6. FIG. 8 is a flow chart illustration of one process according to the invention for manufacturing recording heads using system 70 of FIG. 7. As depicted in the flow chart and with reference to the preceding figures, one process according to the invention comprises the following steps: Step one 92) pattern a multi-layer lithographically fabricated device with structural and marker elements disposed in the manner described above and illustrated in FIGS. 3(a)–4(b); Step two 94) cleave the multi-layer device to expose a geometrical surface that extends transversely to the layers and that substantially contains the structural and marker elements as illustrated in FIGS. 4(b)–6; Step three 96) generate images of the marker elements of FIG. 6 by scanning the ion beam of FIG. 7 in the vicinity of the marker elements and by detecting secondary particles emitted as a result of the ion bombardment, and generate, using the location processor 115 of FIG. 7, X & Y marker coordinates based on the marker element images; Step four 98) generate, also using the location processor 115, X & Y milling coordinate instructions for the second structural element based on the X & Y marker coordinates; and Step five 100) scan the ion beam of FIG. 7 to mill the second structural element of FIG. 6 without irradiating the first structural element. In another embodiment of the invention, step three 96 of the process outlined in FIG. 8 includes the further step of generating an image of the second structural element.

Returning to FIG. 6, it shows trim outlines 82a and 82b over portions of the write head. Each trim outline 82a and 82b represents a selected portion of the recording head to be removed by a focused particle beam milling process. Importantly, the trim outlines can have a variety of geometrical shapes including rectangular, square, and polygonal. In the depicted embodiment, the trim outlines 82a and 82b identify two etching areas. Within these etching areas a focused particle beam will selectively remove portions of the write head to provide a pole-tip assembly that has a desired configuration. A desired pole-tip configuration can include a specified separation of the read and write heads along the second axis.

Figure 9:
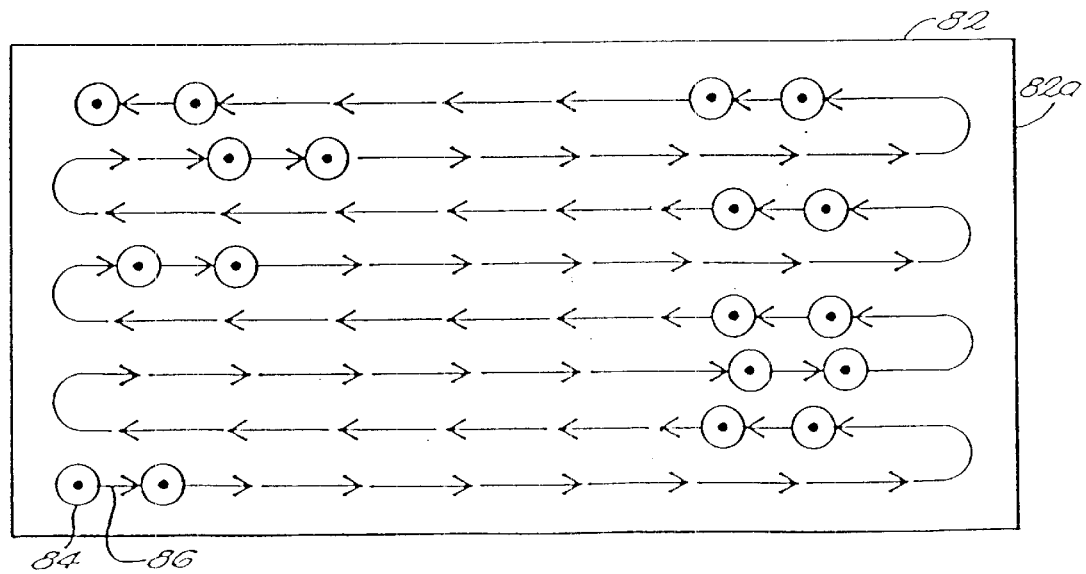
FIG. 9 illustrates schematically the sequence of a raster scan of a focused particle beam within the trim outlines of FIG. 6.

FIG. 9 shows the process of a raster scan of a focused particle beam within the trim outlines of FIG. 6. With reference to FIG. 7, the trim outlines 82a and 82b represent where the focused particle beam will mill the multi-layer device. The processor 112, based on the X & Y marker coordinates, directs the particle beam 80 to mill the surface of the recording head 90 in accordance with the trim outlines. Again, it is important to note that the trim outlines do not have to be rectangular as shown. The trim outlines can have a variety of geometrical shapes. In one embodiment, the processor 112 generates a series of milling instructions for operating the ion column 72 to implement a digital raster pattern as depicted in FIG. 9. FIG. 9 illustrates a digital raster pattern 82 that comprises a series of pixel locations 84 with a corresponding pitch 86. The digital raster pattern shown is a serpentine raster pattern. However, manufacturers can employ a variety of raster patterns including a spiral pattern. Furthermore, the pitch is usually smaller than the beam spot size. A typical beam spot size is between approximately 0.7 microns and 0.2 microns. As depicted in FIG. 9, the processor element 112 generates a set of milling instructions which represent the X and Y locations for directing the particle beam 80 to mill the surface of the recording head 90 and remove the portion of the recording head outlined by the trim outlines 82a, 82b. Importantly, the processor is programmable.

Figure 10A:
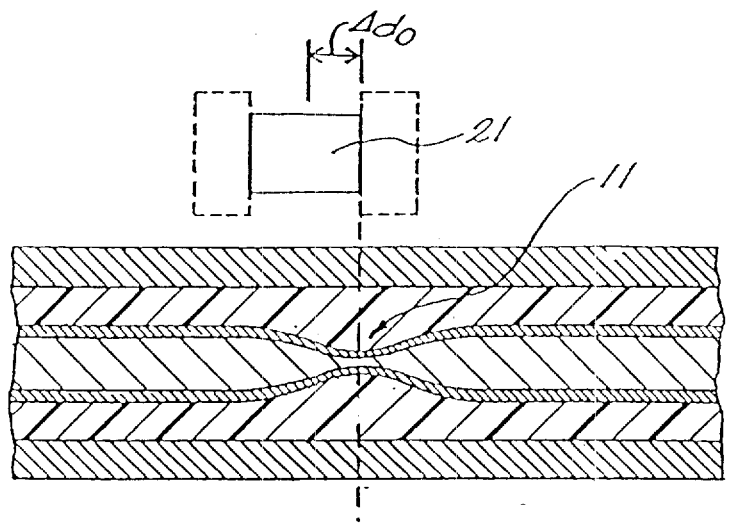
FIG. 10(a) shows one embodiment of the recording head of FIG. 1 with a desired pole-tip configuration as seen from the plane of the cleaved surface.

FIG. 10(a) is a view of one embodiment of the recording head of FIG. 1 seen from the plane of the magnetic medium with the pole-tip configuration represented in FIG. 6 changed due to focused particle beam milling. The focused particle beam system 70 has selectively removed portions of the write head 21 so as to produce a desired configuration of the recording head and a desired separation of the read and write head along the third axis, illustrated as the X axis.

Figure 10B:
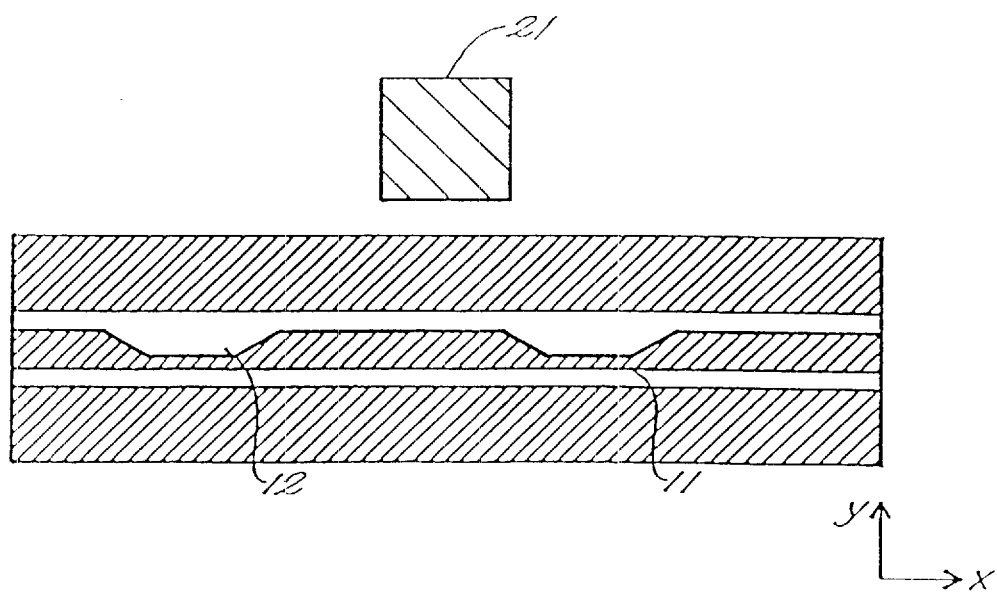
FIG. 10(b) shows another embodiment of the multi-layer device of FIG. 3(b) Without a second marker element.

FIG. 10(b) is another embodiment of the multi-layer lithographically fabricated device of according to the invention. This multi-layer device is similar to the device of FIG. 3b. This multi-layer device is different from the device shown in FIG. 3b in that it does not contain a second marker element 22. FIG. 10(b) includes a first structural element 11, a second structural element 21, and a first marker element 21.

Figure 10C:
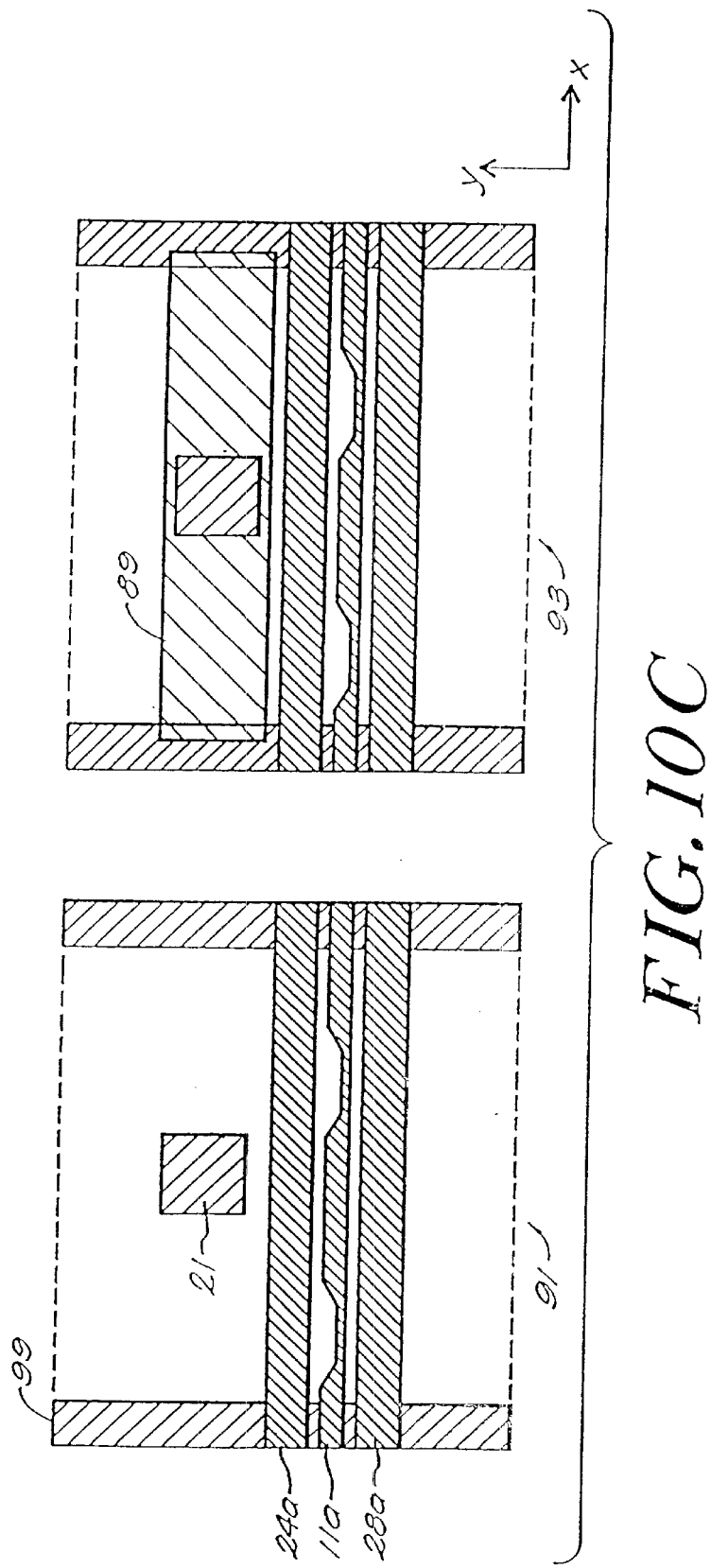
FIG. 10(c) illustrates the first two steps in a fours step process of fabricating the thin-film recording head of FIG. 2 from the multi-layer device of FIG. 10(b)

FIG. 10(c) shows the first two steps in a four step process for fabricating the thin-film recording head of FIG. 2 using the multi-layer device of FIG. 10(b). In the first step 91, the focused ion beam system 70 locates the top edge of layer 24a. The system 70 locates the top edge of layer 24a by imaging a vertical section 99 of the multi-layer device avoiding the structural and marker elements. For example, the system can image a vertical section on the far left side 99 of the multi-layer device. In the second step 93., having located the upper edge of layer 24a, the system obtains a vertical reference point. In the illustrated embodiment, the vertical axis is the Y axis.

Having obtained a vertical reference point, the system can then image a horizontal section 89 of the multi-layer device, the vertical location of the horizontal section being appropriately located to image the second structural element 21, based on the previously determined location of the upper edge of layer 24a. From the horizontal section image, the system 70 obtains the center point of element 21.

Figure 10D:
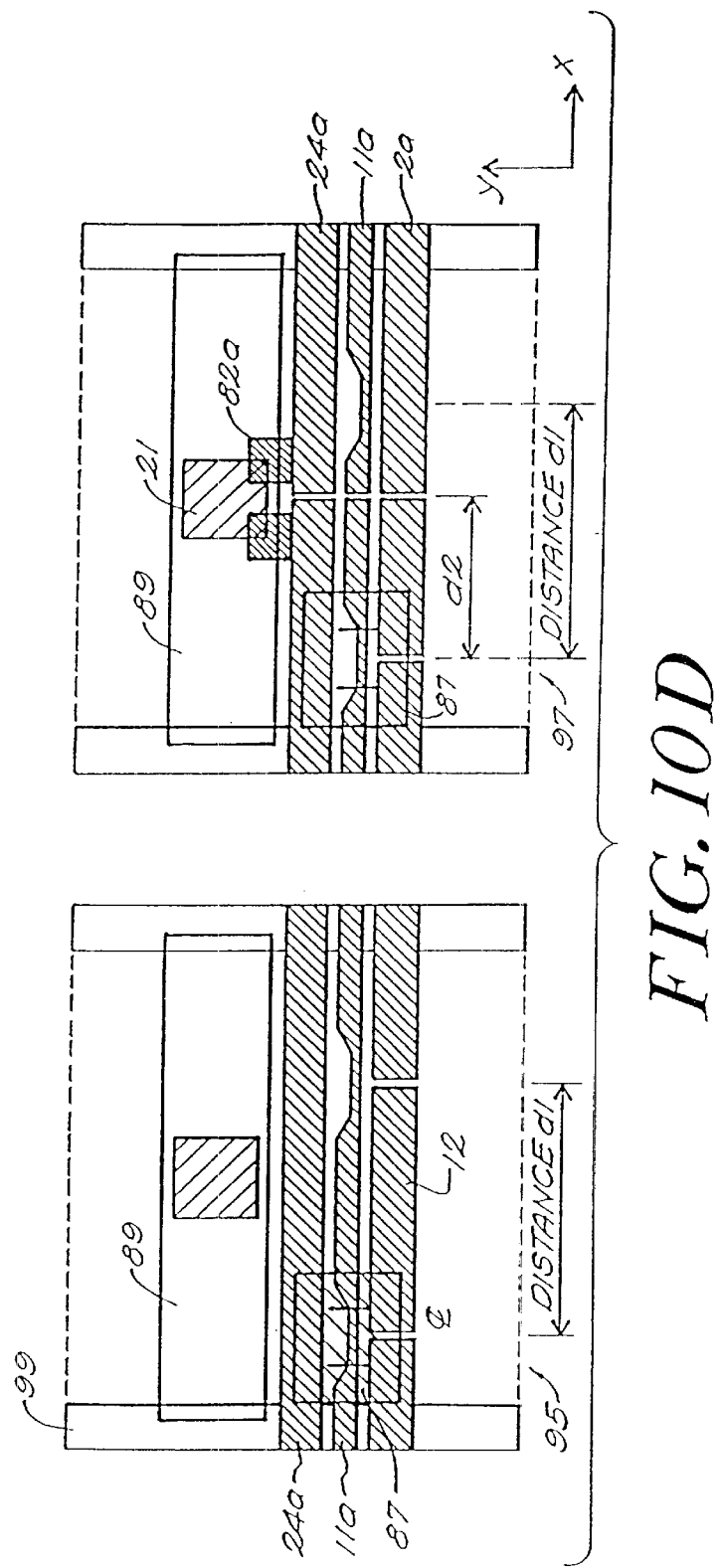
FIG. 10(d) illustrates the last two steps in a four step process of fabricating the thin film recording head of FIG. 2 from the multi-layer device of FIG. 10(b).

FIG. 10(d) shows the last two steps in a four step process of the fabrication of the thin-film recording head of FIG. 2 from the multi-layer device of FIG. 10(a). In a third step 95, the system 70 images a section 87 avoiding the first structural element 11 and locating element 12. In a fourth step 97, the system 70 determines the location of second structural element 21, places trim outlines 82a, and mills element 21 to produce a desired pole-tip configuration including a correct offset between the structural elements.

As can be seen from the above description, the invention provides improved systems and methods for forming thin film recording heads and for employing a focused particle beam to manufacture thin-film recording heads. It will be appreciated by those skilled in the art of thin film recording manufacturing techniques that changes can be made to the embodiments and processes described above without departing from the broad inventive concept thereof. It will further be understood therefore, that the invention is not to be limited to the particular embodiments disclosed herein but is intended to cover modifications within the spirit and scope of the present invention as defined by the appended claims.

What is claimed is:

1. A lithographic process for fabricating thin-film magnetic recording heads, said process having the improvement comprising the steps of a) in a first lithographic step, patterning a first structural element and, at a known distance and direction relative thereto, patterning a first marker element, where said first structural element and said first marker element are on a common first lithographically formed layer, and b) in a second lithographic step, patterning a second structural element, where said second structural element is on a second lithographically formed layer different from said first layer, c) said patterning steps providing said structural elements and said marker element located to intersect a geometrical surface that extends transversely to said first and second layers, so that viewing said first marker element and said second structural element, at said geometrical surface, provides information for locating said second structural element relative to said first structural element.

2. The lithographic process of claim 1, in which said geometrical surface is substantially planar.

3. The lithographic process of claim 1, including a further step of cleaving said first and second layers along said geometrical surface.

4. The lithographic process of claim 1, wherein the second lithographic step includes a further step of patterning a second marker element at a know distance and direction relative to said second structural element, where said second structural element and said second marker element are on a common second lithographically formed layer different from said first layer, said patterning steps providing said structural elements and said marker elements located to intersect a geometrical surface that extends transversely to said first and second layers, so that viewing said first and second marker elements, at said geometrical surface, provides information for locating said second structural element relative to said first structural element.

5. The lithographic process of claim 4, including a further step of providing said marker elements with selected spatial overlap along a first axis.

6. The lithographic process of claim 5, including a further step of providing said first and second structural elements with selected spatial overlap along an axis parallel to said first axis.

* * * * *